(12) United States Patent
Funaki et al.

(10) Patent No.: US 8,409,784 B2
(45) Date of Patent: Apr. 2, 2013

(54) PHOTOSENSITIVE RESIN COMPOSITION, DRY FILM, AND PROCESSED PRODUCT MADE USING THE SAME

(75) Inventors: Katsuhiko Funaki, Sunnyvale, CA (US); Etsuo Ohkawado, Chiba (JP); Kousuke Hirota, Urayasu (JP); Syuji Tahara, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 553 days.

(21) Appl. No.: 12/596,952

(22) PCT Filed: Apr. 23, 2008

(86) PCT No.: PCT/JP2008/001063
§ 371 (c)(1),
(2), (4) Date: Oct. 21, 2009

(87) PCT Pub. No.: WO2008/132842
PCT Pub. Date: Nov. 6, 2008

(65) Prior Publication Data
US 2010/0084172 A1 Apr. 8, 2010

(30) Foreign Application Priority Data

Apr. 24, 2007 (JP) .................................. 2007-113665
Sep. 19, 2007 (JP) .................................. 2007-242638

(51) Int. Cl.
G03C 1/00 (2006.01)
G03F 7/037 (2006.01)
G03F 7/027 (2006.01)
G03F 7/00 (2006.01)

(52) U.S. Cl. ............... 430/286.1; 430/283.1; 430/287.1; 430/278.1; 430/311; 430/319; 428/209

(58) Field of Classification Search ............... 430/278.1, 430/283.1, 286.1, 287.1, 311, 319; 428/209
See application file for complete search history.

(56) References Cited

U.S. PATENT DOCUMENTS

| | | | | |
|---|---|---|---|---|
| 4,540,809 A | * | 9/1985 | Yokoshima et al. | 560/185 |
| 4,963,645 A | * | 10/1990 | Inoue et al. | 528/342 |
| 5,326,792 A | * | 7/1994 | Masaki et al. | 522/135 |
| 5,756,260 A | * | 5/1998 | Sashida et al. | 430/283.1 |
| 6,610,815 B1 | * | 8/2003 | Hata et al. | 528/310 |
| 7,030,170 B2 | | 4/2006 | Tahara et al. | |
| 7,851,124 B2 | * | 12/2010 | Funaki et al. | 430/270.1 |
| 2004/0247908 A1 | * | 12/2004 | Funaki et al. | 428/473.5 |
| 2005/0170270 A1 | * | 8/2005 | Funaki et al. | 430/57.3 |
| 2008/0306180 A1 | | 12/2008 | Amishima et al. | |
| 2010/0059263 A1 | * | 3/2010 | Funaki et al. | 174/258 |
| 2010/0116532 A1 | * | 5/2010 | Funaki et al. | 174/258 |

FOREIGN PATENT DOCUMENTS

| | | |
|---|---|---|
| CN | 1898299 A | 1/2007 |
| JP | 2000-338667 A | 12/2000 |
| JP | 2001-163936 A | 6/2001 |
| JP | 2004-29702 A | 1/2004 |
| JP | 2005-283762 A | 10/2005 |
| JP | 2005-300785 A | 10/2005 |
| JP | 2006-220804 A | 8/2006 |
| JP | 2006-251715 A | 9/2006 |
| JP | 2007-293001 A | 11/2007 |
| WO | WO 02/24774 A1 | 3/2002 |

OTHER PUBLICATIONS

International Search Report (PCT/ISA/210) dated Jul. 15, 2008.

* cited by examiner

*Primary Examiner* — Sanza McClendon

(74) *Attorney, Agent, or Firm* — Buchanan Ingersoll & Rooney PC

(57) ABSTRACT

Disclosed is a photosensitive resin composition which does not contain any halogenated compound or any antimony compound that has a high risk of putting a load on the environment, which exerts good flame retardancy after being cured, and which particularly meets the recent exacting requirements with respect to bending resistance and insulation reliability. Specifically disclosed is a photosensitive resin composition comprising: (A) a (meth)acrylate compound represented by the general formula (1); (B) a polyimide precursor; and (C) a photopolymerization initiator [in the formula, $R_1$ represents a hydrogen atom or a methyl group; $R_2$ represents a hydrogen atom or a univalent organic group; n and m independently represent an integer of 1 to 5; p represents an integer of 0 to 6; q and r independently represent an integer of 0 to 4; and s represent an integer of 0 to 6, provided that the sum of p, q, r and s is 6, and the sum total of p and s may range from 3 to 6 and is preferably 6].

9 Claims, No Drawings

PHOTOSENSITIVE RESIN COMPOSITION, DRY FILM, AND PROCESSED PRODUCT MADE USING THE SAME

TECHNICAL FIELD

The present invention relates to a photosensitive resin composition, a dry film, and a processed product made using the same.

BACKGROUND ART

In recent years, solder resists are used as one of protection films for the circuit surface during printed wiring board production. For high packing density, solder resists have been increasingly required to have both high fine patterning capability and high positional accuracy. As a protection film production method that can meet the above requirements, photolithographic patterning using photosensitive resin compositions is widely used. Examples of such photosensitive resin compositions are epoxy-based compositions, which have been widely used as solder resist materials for protection films on metal interconnections (see e.g., Patent Documents 1 and 2).

However, as conventional materials used as sources of protection films contain large amounts of inorganic filler such as barium sulfate or silica, the films produced from these materials have the disadvantages of being less flexible and thus unable to be subjected to bending processing.

To solve this problem protection films are produced using two different materials during printed wiring board manufacture, where a film called "cover lay" is applied to bending areas and a photosensitive solder resist is applied only to patterning areas. A "cover lay" refers to a polyimide film coated with an adhesive. While many of the solder resists are prepared by coating of printed wiring boards with liquid solutions, adhesive-coated polyimide films are folded with a mold and then attached to printed circuit boards with a pressing machine. Thus, with this method, problems like yield reduction occurred due to involvement of two different steps, thus resulting in demand for solder resists which are capable of fine patterning while ensuring flexibility and heat resistance.

Moreover, from the viewpoint of environment protection, recycling of finished products has been strongly encouraged. In this connection, products are strongly desired that can prevent generation of polluting chemicals during the recycling process. However, the current situation is that resin materials used as cover lay materials and interlayer insulating materials for flexible printed wiring boards require sufficient flame retardancy and, therefore, for flame retardancy, many of the resin materials need to contain either halogenated compounds (e.g., brominated aromatic compounds) which will produce dioxins when burned, or toxic antimony compounds. Therefore, halogen- and antimony-free materials with excellent flame retardancy and flexibility as well as high insulation reliability are strongly desired.

Photosensitive cover lay materials for flexible printed wiring boards which can meet the above requirements have been suggested (see e.g., Patent Documents 3-5). Nevertheless, neither of the disclosed materials can sufficiently meet the recent stringent requirements for flexibility and insulation reliability.

Patent Document 1: International Application Publication No. WO02/24774
Patent Document 2: Japanese Patent Application Laid-Open No. 2005-300785
Patent Document 3: Japanese Patent Application Laid-Open No. 2004-029702
Patent Document 4: Japanese Patent Application Laid-Open No. 2005-283762
Patent Document 5: Japanese Patent Application Laid-Open No. 2006-251715

DISCLOSURE OF INVENTION

Problems to be Solved by the Invention

It is therefore an object of the present invention to provide a photosensitive resin composition which exerts good flame retardancy after being cured and which particularly meets the recent stringent requirements for bending durability and insulation reliability, even without any halogenated compound or antimony compound that has a high risk of putting a load on the environment.

Another object of the present invention is to provide a dry film produced from the above photosensitive resin composition. Still another object of the present invention is to provide a processed product having a resin film obtained by laminating and curing the dry film, and an electric device having the resin film.

Means for Solving the Problem

The inventors conducted extensive studies and established that a photosensitive resin composition containing a specific (meth)acrylate compound, polyimide precursor and photopolymerization initiator can meet the stringent requirement for bending durability and insulation reliability.

A first aspect of the present invention relates to the following photosensitive resin composition.

[1] A photosensitive resin composition including:
 (A) (meth)acrylate compound having the following general formula (1);
 (B) polyimide precursor; and
 (C) photopolymerization initiator.

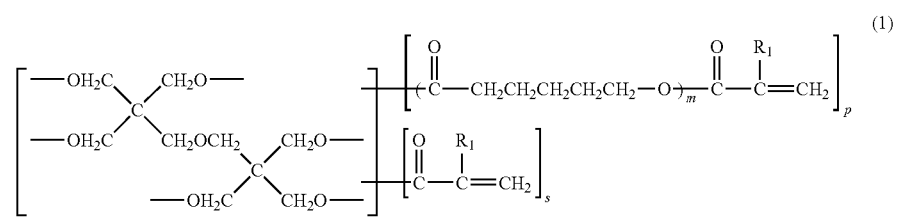

(where $R_1$ denotes a hydrogen atom or methyl group; m denotes an integer of 1 to 5; p and s each denote an integer of 0 to 6; and the sum of p and s is 6)

[2] A photosensitive resin composition including:
(A) (meth)acrylate compound having the following general formula (1');
(B) polyimide precursor; and
(C) photopolymerization initiator,
wherein (B) polyimide precursor is a polyamic acid produced from a carboxylic acid dianhydride and a diamine having the following general formula (2).

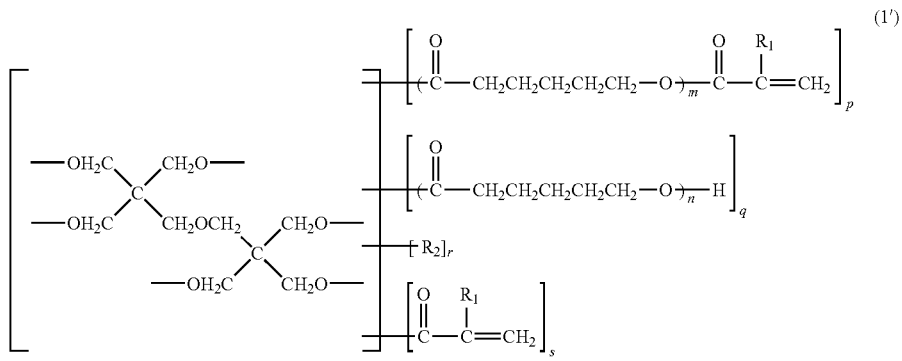

(where $R_1$ denotes a hydrogen atom or methyl group; $R_2$ denotes a hydrogen atom or monovalent organic group; n and m each denote an integer of 1 to 5; p denotes an integer of 0 to 6; q and r each denote an integer of 0 to 4; and s denotes an integer of 0 to 6, wherein the sum of p, q, r and s is 6, and the sum of p and s ranges from 3 to 6)

$$H_2N-(R_3O)_n-R_4-NH_2 \quad (2)$$

(where $R_3$ and $R_4$ each denote an aliphatic hydrocarbon group having 1-6 carbon atoms, and n denotes an integer of 1 to 30)

[3] The photosensitive resin composition according to [1], wherein the amount of (A) (meth)acrylate compound is 1-140 parts by mass per 100 parts by mass of (B) polyimide precursor.

[4] The photosensitive resin composition according to [2], wherein the amount of (A) (meth)acrylate compound is 3-200 parts by mass per 100 parts by mass of (B) polyimide precursor.

[5] The photosensitive resin composition according to [1] or [2], wherein (B) polyimide precursor is a polyamic acid.

[6] The photosensitive resin composition according to [1] or [2], further including (E) flame retardant in an amount of 1-70 parts by mass per 100 parts by mass of the total of (A) (meth)acrylate compound, (B) polyimide precursor and (C) photopolymerization initiator.

A second aspect of the present invention relates to the following dry film, processed product and electric device obtained using the photosensitive resin composition.

[7] A dry film produced from a photosensitive resin composition according to [1] or [2].

[8] A processed product including a resin film formed of a dry film according to [7].

[9] The processed product according to [8], wherein the processed product is a printed wiring board.

[10] An electric device including a processed product according to [9].

Advantageous Effects of Invention

With a photosensitive resin composition of the present invention, it is possible to provide a high-density flexible printed wiring board which exerts good flame retardancy after being cured and which particularly meets the recent stringent requirements for bending durability and insulation reliability, even without any halogenated compound or any antimony compound that has a high risk of putting a load on the environment.

In addition, as the photosensitive resin composition can be readily provided in the form of dry film product, it may contribute to enhance printed wiring board productivity and reduce a load on the environment. By virtue of its photosensitivity, the resin composition can achieve high patterning accuracy. In addition, the resin composition can provide an environmentally-friendly interconnection protection film which is excellent in bending durability, flexibility, adhesion, insulation reliability, and flame retardancy.

BEST MODE FOR CARRYING OUT THE INVENTION

A photosensitive resin composition of the present invention contains (A) (meth)acrylate compound, (B) polyimide precursor, and (C) photopolymerization initiator.

(A) (Meth)acrylate compound contained in a photosensitive resin composition of the present invention is represented by the following general formula (1').

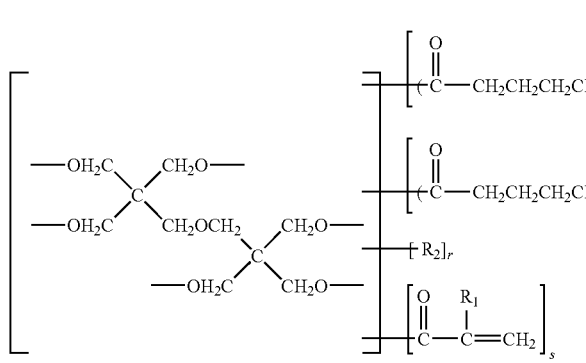
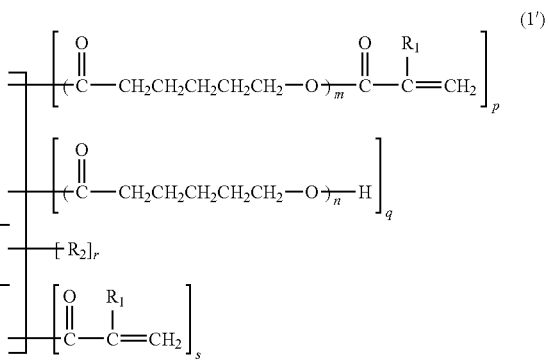

In the general formula (1'), $R_1$ denotes a hydrogen atom or methyl group; $R_2$ denotes a hydrogen atom or monovalent organic group; n and m each denote an integer of 1 to 5; p denotes an integer of 0 to 6; q and r each denote an integer of 0 to 4; and s denotes an integer of 0 to 6, wherein the sum of p, q, r and s is 6, and the sum of p and s ranges from 3 to 6.

Specific examples of the monovalent organic group denoted by $R_2$ include alkyl groups; carboxy-terminated organic groups formed by ring-opening addition reaction of acid anhydrides (e.g., succinic acid anhydride, itaconic acid anhydride, phthalic acid anhydride, and tetrahydrophthalic acid anhydride) with methylhydroxyl group; vinyl group; and glycidyl group. Preferred examples of $R_2$ are hydrogen atom, methyl group, ethyl group, and propyl group, with hydrogen atom being more preferable.

In the general formula (1'), n and m are each preferably 1 or 2, and the sum of p and s is preferably 5 or 6, i.e., q and r are each 1 or less.

The sum of p and s is more preferably 6, i.e., q and r are both zero. Compounds having general formula (1') in which the sum of p and s is 6 are compounds represented by the following formula (1).

hexaacrylate (p+s=6), and condensates of dipentaerythritol and c-caprolactone which are esterified with acrylic acids or methacrylic acids.

These compounds are available under the names of KAYARAD-DPHA, KAYARAD-DPCA20, KAYARAD-DPCA30, KAYARAD-DPCA60 and KAYARAD-DPCA120 from NIPPON KAYAKU Co., Ltd.; ARONIX M-402 from TOAGOSEI Co., Ltd., which contains a compound in which the sum of p and s is 6 in an amount of 60-70 mol % based on the total amount of the compound in which the sum of p and s is 6 and a compound in which the sum of p and s is 5; LIGHT ACRYLATE DPE-6A from KYOEISHA CHEMICAL Co., Ltd.; DPHA from Daicel-UCB Company, Ltd.; and Actilane 450 from AKCROS CHEMICALS, Ltd.

These compounds can also be prepared by esterifying dipentaerythritol or condensates of dipentaerythritol and c-caprolactone with acrylic acids or methacrylic acids.

The amount of a (meth)acrylate compound having general formula (1'), including a compound having general formula (1), is preferably 3-200 parts by mass, more preferably 5-200 parts by mass, further preferably 10-50 parts by mass, per 100 parts by mass of (B) polyimide precursor. By setting this (meth)acrylate compound content to 200 parts by mass or less, non-exposed portions retain solubility enough for development with an alkaline solution and a cured product after imidization retains flexibility.

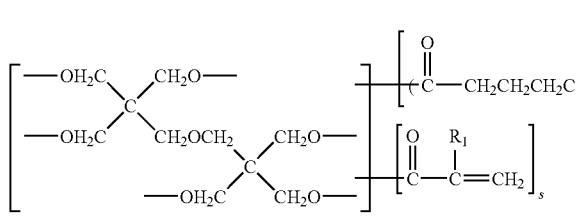

(where $R_1$ denotes a hydrogen atom or methyl group; m denotes an integer of 1 to 5; p and s each denote an integer of 0 to 6; and the sum of p and s is 6)

Cured resin films produced from photosensitive resin compositions containing compounds having general formula (1) particularly exhibit improved bending durability. Thus, it is preferable that a compound having general formula (1) constitute 40-100 mol % of a compound having general formula (1) in the photosensitive resin composition.

Among compounds having general formula (1'), examples of compounds in which the sum of p and s is 5 or 6 include dipentaerythritol pentaacrylate (p+s=5), dipentaerythritol As described above, a compound having general formula (1) preferably constitutes 40-100 mol % of a (meth)acrylate compound having general formula (1') in a photosensitive resin composition of the present invention. Thus, the amount of a compound having general formula (1) in the photosensitive resin composition is preferably about 1-200 parts by mass, preferably about 1-140 parts by mass, per 100 parts by mass of (B) polyimide precursor.

In addition to the (meth)acrylate compound having general formula (1') or (1), a photosensitive resin composition of the present invention may contain an additional photopolymerizable compound depending on the intended purpose.

Examples thereof include monofunctional acrylate compounds and multifunctional acrylate compounds.

Examples of monofunctional acrylate compounds include 2-hydroxyethyl (meth)acrylate, 2-hydroxypropyl (meth) acrylate, 2-ethylhexyl (meth)acrylate, phenoxyethyl acrylate, stearyl methacrylate, lauryl acrylate, dicyclopentenyl acrylate, dicyclopentenyloxyethyl acrylate, dicyclopentanyl acrylate, tetramethylpiperidyl methacrylate, benzyl methacrylate, glycidyl methacrylate, glycerin monomethacrylate, polyethylene glycol mono(meth)acrylate, polypropylene glycol (meth)acrylate, methoxypolyethylene glycol mono(meth) acrylate, and 2-hydroxy-3-phenoxypropyl (meth)acrylate.

Examples of multifunctional acrylate compounds include ethylene glycol di(meth)acrylate, diethylene glycol di(meth) acrylate, triethylene glycol di(meth)acrylate, polyethylene glycol di(meth)acrylate, 1,3-butylene glycol di(meth)acrylate, 1,6-hexanediol di(meth)acrylate, neopentyl di(meth) acrylate, polypropylene glycol di(meth)acrylate, ethylene oxide-modified bisphenol A di(meth)acrylate, ethylene oxide/propylene oxide-modified bisphenol A di(meth)acrylate, tetramethylene oxide-modified bisphenol A di(meth) acrylate, propylene oxide-modified bisphenol A di(meth) acrylate, propylene oxide/tetramethylene oxide-modified bisphenol A di(meth)acrylate, ethylene oxide-modified bisphenol F di(meth)acrylate, ethylene oxide/propylene oxide-modified bisphenol F di(meth)acrylate, tetramethylene oxide-modified bisphenol F di(meth)acrylate, propylene oxide-modified bisphenol F di(meth)acrylate, propylene oxide/tetramethylene oxide-modified bisphenol F di(meth) acrylate, pentaerythritol triacrylate, pentaerythritol tetraacrylate, trimethylolpropane triacrylate, trimethylolpropane/propylene oxide-modified triacrylate, isocyanurate ethylene oxide-modified diacrylate, glycerin di(meth)acrylate, urethane acrylates having two or more (meth)acryloyl groups, urethane (meth)acrylate polyester acrylates, and compounds obtained by modifying epoxy groups of epoxy compounds with acrylic acids.

The additional photopolymerizable compound is preferably contained in such an amount that does not impair the effect of the present invention. Specifically, the amount of the additional photopolymerizable compound may be about 1-30 parts by mass per 100 parts by mass of a compound having general formula (1') (including a compound having general formula (1)).

Examples of (B) polyimide precursor used in the present invention include polyamic acids and polyamic acids in which some of the carboxylic groups are esterified. Polyamic acids have excellent characteristics as insulating resin and thus are advantageous in industrial production. It is thus preferable to employ polyamic acids as (B) polyimide precursor.

A polyamic acid is a polyimide precursor obtained by reaction between an acid dianhydride (e.g., pyromellitic acid dianhydride) and a diamine (e.g., 1,3-bis(4-aminophenoxy) benzene) in polar organic solvent.

Examples of acid dianhydrides used as sources of polyimide precursors include pyromellitic acid dianhydride, 3,3',4, 4'-benzophenonetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 1,1-bis(2,3-dicarboxylphenyl)ethane dianhydride, 2,2-bis(2,3-dicarboxylphenyl)ethane dianhydride, 2,2-bis(3,3-dicarboxylphenyl)ethane dianhydride, 2,2-bis[4-(3,4-dicarboxyphenoxy)phenyl]propane dianhydride, 4,4'-oxydiphthalic acid dianhydride, 2,3,3',4'-biphenylethertetracarboxylic acid dianhydride, 2,3,5,6-pyridinetetracarboxylic acid dianhydride, 3,4,9,10-perylenetetracarboxylic acid dianhydride, 2,3,3',4'-benzophenonetetracarboxylic acid dianhydride, 3,3',4,4'-benzophenonetetracarboxylic acid dianhydride, and 3,4,3',4'-biphenyltetracarboxylic acid dianhydride.

For increased compatibility between polyamic acid and other components contained in a photosensitive resin composition, preferred examples of acid dianhydrides as sources of polyimide precursors are, for example, pyromellitic acid dianhydride, 4,4'-oxydiphthalic acid dianhydride, 3,3',4,4'-benzophenonetetracarboxylic acid dianhydride and 3,4,3',4'-biphenyltetracarboxylic acid dianhydride, with pyromellitic acid dianhydride, 4,4'-oxydiphthalic acid dianhydride and 3,4,3',4'-biphenyltetracarboxylic acid dianhydride being more preferable, although depending on the composition of other components in the photosensitive resin composition.

Examples of diamines used as sources of polyimide precursors include aromatic diamines, polyalkylene glycol diamines, and alkyl diamines. It should be noted that different diamines may be used alone or in combination.

Examples of aromatic diamines include 3,3'-diaminodiphenylether, 4,4'-diamino-3,3',5,5'-tetramethyldiphenylmethane, 4,4'-diamino-3,3'-diethyl-5,5'-dimethyldiphenylmethane, 4,4'-diaminodiphenyl-2,2'-propane, 4,4'-diaminodiphenylmethane, 3,4'-diaminobenzanilide, 4,4'-diaminobenzanilide, 3,3'-diaminobenzophenone, 4,4'-diaminobenzophenone, 3,3'-diethyl-4,4'-diaminodiphenylether, 3,3'-diethoxy-4,4'-diaminodiphenylmethane, 3,3'-dimethyl-4,4'-diaminodiphenylmethane, 3,3'-dimethyl-4,4'-diaminodiphenylpropane, 3,3'-diethyl-4,4'-diaminodiphenylpropane, 3,3'-dimethyl-5,5'-diethyl-4,4'-diaminodiphenylmethane, 3,3'-dimethoxy-4,4'-diaminodiphenylether, 3,3'-dimethoxy-4,4'-diaminodiphenylmethane, 3,3'-dimethoxy-4,4'-diaminodiphenylsulfone, 3,3'-dimethoxy-4,4'-diaminodiphenylpropane, 3,3'-diethoxy-4,4'-diaminodiphenylpropane, 3,3',5,5'-tetramethyl-4,4'-diaminodiphenylmethane, 3,3',5,5'-tetraethyl-4,4'-diaminodiphenylmethane, polytetramethylene oxide-di-p-aminobenzoate, polyethylene oxide-di-p-aminobenzoate, polypropylene oxide-di-p-aminobenzoate, 4,4'-bis(3-aminophenoxy)biphenyl, 4,4'-bis(4-aminophenoxy)biphenyl, 1,3-bis(3-aminophenoxy)benzene, 1,3-bis(4-aminophenoxy)benzene, 1,4-bis(4-aminophenoxy)benzene, 1,3-bis[3-(aminophenoxy)phenyl]benzene, bis[4-(4-aminophenoxy) phenyl]ether, and 2,2'-bis[4-(4-aminophenoxy)phenyl] propane.

Polyalkylene glycol diamines are represented by the following general formula (2), for example. In general formula (2), $R_3$ and $R_4$ each denote an aliphatic hydrocarbon group having 1-6 carbon atoms, and n denotes an integer of 1 to 30, preferably 2 to 20.

$$H_2N-(R_3O)_n-R_4-NH_2 \qquad (2)$$

Examples of polyalkylene glycol diamines include polyethylene glycol diamine, polypropylene glycol diamine, polybutylene glycol diamine, polytetramethylene glycol diamine, diamines having block copolymers of polyethylene glycol and polypropylene glycol, diamines having block copolymers of polyethylene glycol and polytetramethylene glycol, diamines having block copolymers of polypropylene glycol and polytetramethylene glycol, and diamines having block copolymers of polyethylene glycol, polypropylene glycol and polytetramethylene glycol. Specifically, each of $R_3$ and $R_4$ may be a combination of different aliphatic hydrocarbon groups.

Preferred examples of polyalkylene glycol diamines include polypropylene glycol diamine and diamines having copolymers of polypropylene glycol and polytetramethylene glycol.

Examples of alkyl diamines include dodecane diamine and hexamethylene diamine.

Examples of the most preferable diamines as sources of polyimide precursors include 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, and polyalkylene glycol diamines such as polypropylene glycol diamine and polybutylene glycol diamine.

By employing polyalkylene glycol diamines as diamine sources of (B) polyimide precursor, low-temperature curability can be achieved and the resulting polyimide film exhibits improved flexibility and less warpage, but heat resistance may decrease. Thus, it is generally preferable to copolymerize a polyalkylene glycol diamine with another heat-resistant aromatic diamine compound. The mole ratio of the polyalkylene glycol diamine to the heat-resistant aromatic diamine compound is preferably such that 0.05-4.9 moles of the polyalkylene glycol diamine is contained per 1 mole of the heat-resistant aromatic diamine compound. When the mole ratio of the polyalkylene glycol diamine to the aromatic diamine compound is 5.0 or more, heat resistance may decrease. When the mole ratio is 0.05 or more, flexibility remarkably enhances and warpage amount may decrease.

A polyamic acid is prepared by polymerization of the above diamine compound with the above acid dianhydride. The reaction temperature is typically 10-60° C., preferably 20-55° C. The reaction pressure is not specifically limited. The resultant polyamic acid may be partially imidized. Partially-imidized polyamic acids can be prepared by dehydration at elevated temperature around 100-200° C. for imidization or by catalytic synthesis, for example. The reaction time varies depending on the type of the organic solvent used, reaction temperature, etc., and the time sufficient for the reaction to complete is typically 2-48 hours.

The amount of the polyimide precursor contained in the photosensitive resin composition is 10-95 wt %, preferably 30-70 wt %, on a solid content basis. When the polyimide precursor content is 10 wt % or more, the solubility of non-exposed portions in alkaline solution after exposure increases and thereby high resolution can be obtained, and furthermore, polyimide features such as heat resistance, chemical resistance and electrical insulating properties are exerted in the final cured film. By setting the polyimide precursor content to 95 wt % or less, the polyimide film exerts photosensitivity and thus can be cured by irradiation with UV or the like, enabling photolithographic pattern formation.

Examples of (C) photopolymerization initiator contained in the photosensitive resin composition include benzophenone, Michler's ketone, benzoin, benzoin ethyl ether, benzoin butyl ether, benzoin isobutyl ether, 2,2-dimethoxy-2-phenylacetophenone, 2-hydroxy-2-phenylacetophenone, 2-hydroxy-2-methylpropiophenone, 2-hydroxy-4-isopropyl-2-methylpropiophenone, 2-ethylanthraquinone, 2-t-butylanthraquinone, diethylthioxanthone, chlorothioxanthone, benzil, benzyl dimethyl ketal, 1-hydroxycyclohexyl phenyl ketone, benzoylbenzoic acid, 2-methyl-1-(4-methylthiophenyl)-2-morpholinopropane-1-one, 2-benzyl-2-dimethylamino-1-(4-morpholinophenyl)-butanone-1, and 2,4,6-trimethylbenzoyldiphenylphosphine oxide.

Additional examples of (C) photopolymerization initiator include 1 mole adduct or 2-4 mole adducts of ethylene oxide to benzoin; 1 mole adduct or 2-4 mole adducts of propylene oxide to benzoin; α-allylbenzoin; mole adduct or 2-4 mole adducts of ethylene oxide to 1-hydroxycyclohexyl phenyl ketone; 1 mole adduct or 2-4 mole adducts of propylene oxide to 1-hydroxycyclohexyl phenyl ketone; 1 mole adduct of or 2-4 mole adducts of ethylene oxide to benzoylbenzoic acid; 1 mole adduct or 2-4 mole adducts of propylene oxide to benzoylbenzoic acid; 1 mole adduct or 2-4 mole adducts of ethylene oxide to hydroxybenzophenone; 1 mole adduct or 2-4 mole adducts of propylene oxide to hydroxybenzophenone; 4-(2-hydroxyethoxy)-phenyl-(2-hydroxy-2-propyl)ketone; 4-(2-acryloxyethoxy)-phenyl-(2-hydroxy-2-propyl)ketone; 1 mole adduct or 2-4 mole adducts of ethylene oxide to 4-(2-hydroxyethoxy)-phenyl-(2-hydroxy-2-propyl)ketone; 1 mole adduct or 2-4 mole adducts of propylene oxide to 4-(2-hydroxyethoxy)-phenyl-(2-hydroxy-2-propyl)ketone; 1-(4-isopropylphenyl)-2-hydroxy-2-methylpropane-1-one; and 1-(4-decylphenyl)-2-hydroxy-2-methylpropane-1-one.

Preferred examples of (C) photopolymerization initiator include diethylthioxanthone, benzyl dimethyl ketal, 1-hydroxy cyclohexylphenyl ketone, 2-methyl-1-(4-methylthiophenyl)-2-morpholinopropane-1-one, 2-benzyl-2-dimethylamino-1-(4-morpholinophenyl)-butanone-1, and 2,4,6-trimethylbenzoyldiphenylphosphine oxide. It should be noted that different (C) photopolymerization initiators may be used alone or in combination.

A photosensitive resin composition of the present invention may contain a photopolymerization initiator aid for increased polymerization efficiency. Examples thereof include triethanolamine, diethanolamine, monoethanolamine, tripropanolamine, dipropanolamine, monopropanolamine, dimethylamino ethyl benzoate, and 4-dimethylamino isoamyl benzoate. It should be noted that different photopolymerization initiator aids may be used alone or in combination.

The amounts of photopolymerization initiator and photopolymerization initiator aid are each 0.05-10 wt %, preferably 0.5-7 wt %, more preferably 0.5-3 wt % based on the solid content of photosensitive resin. By setting the total amount of photopolymerization initiator and photopolymerization initiator aid to 0.1 wt % or more, it is possible to obtain a cured article with a cure degree enough to obtain desired resolution. Moreover, by setting the total amount of photopolymerization initiator and photopolymerization initiator aid to 20 wt % or less, it is possible to moderately adjust the polymerization degree of the photopolymerizable compound and thus to control resolution and flexibility.

A photosensitive resin composition of the present invention may further contain a flame retardant in cases where flame retardancy is insufficient. The flame retardant is not specifically limited; however, preferably, it is generally an organic or inorganic compound other than halogenated organic compounds and antimony compounds. Examples of the flame retardant include, but not limited to, aluminum hydroxide, magnesium hydroxide, magnesium carbonate, calcium carbonate, graphite, heat-expansive graphite, melamine, phosphates, phosphazene compounds, ammonium phosphate, and silicone compounds.

Organic compounds containing a phosphorus atom as a constituent atom exhibit higher flame retardancy and thus can attain flame retardancy even at low content level. For this reason, these organic compounds can provide sufficient flame retardancy without impairing the inherent physical properties of the photosensitive resin and flexibility of the resultant protection film and thus are more preferable flame retardants. Examples of the organic compounds include hexa(phenoxy)

cyclotriphosphazenes (e.g., CAS No. 53051-41-5) and phosphaphenanthrene oxides (e.g., CAS No. 35948-25-5).

Specific examples of available hexa(phenoxy)cyclotriphosphazenes include SPE-100 and SPB-100 from Otsuka Chemical Co., Ltd.; and FP-100 and FP-110 from FUSHIMI Pharmaceutical Co., Ltd. Specific examples of substituted-hexa(phenoxy)cyclotriphosphazenes in which the phenoxy benzene ring is partially substituted with a substituent such as cyano group, hydroxyl group, cyanate group, etc., include FP-300, FP-400 and FP-500 from FUSHIMI Pharmaceutical Co., Ltd. Examples of available phosphaphenanthrene oxides include HCA from Sanko Co., Ltd.

Examples of HCA (9,10-dihydro-9-oxa-10-phosphaphenanthrene-10-oxide) products in which functional groups are introduced by substitution of hydrogen atoms include HCA-HQ (hydroxyquinone-introduced HCA), HCA-BCA (benzyl group-introduced HCA) and SANKO-220 (di-tert-butylphenol-introduced HCA) from Sanko Co., Ltd.; and FA-6007M and HFA-6067P(HCA in which an acrylate having a dipentaerythritol backbone is introduced) from Showa Highpolymer Co., Ltd.

Preferably, the above organic compounds are less crystalline in view of their solubility in solvent upon formulation and compatibility with other components in the resin composition. Moreover, since organic compounds rich in aromatic rings are generally known to have high crystallinity, substituents may be introduced into the compounds to reduce crystallinity. Among the exemplified organic compounds, hexa(phenoxy)cyclotriphosphazenes in which substituent(s) such as cyano group, hydroxyl group, cyanate group, etc., are attached to the phenoxy benzene ring are preferable as they are less crystalline and more compatible than non-substituted ones. In addition, phosphaphenanthrene oxides in which di-tert-butylphenol is introduced are preferable as they are less crystalline and more compatible than non-substituted or benzyl group-substituted ones.

The lower the free chlorine ion concentration in the organic compound having a phosphorus atom in the molecule, the better it is; the free chlorine ion concentration is preferably 100 ppm or less, more preferably 10 ppm or less.

The amount of a flame retardant contained in a photosensitive resin composition of the present invention should be adjusted such that the inherent physical properties of the photosensitive resin are not impaired and desired flame retardancy can be achieved. A typical flame retardant content is 1-70 parts by mass, preferably 1-50 parts by mass, per 100 parts by mass of the solid content (including the above (A) component, (B) component and (C) component), so that flame retardancy requirements for final products can be satisfied.

A photosensitive resin composition of the present invention may further contain additives as needed for the purpose of improving adhesion, varnish antifoaming property, varnish leveling property, etc. Examples of adhesion improvers include 5-mercapto-1-phenyltetrazole, 5-phenyltetrazole, 2-phenylimidazole, and 2,4-diamino-6-phenyl-1,3,5-triazine, which may be used singly or in combination. As antifoaming agents and leveling agents, commercially available acrylic resins and silicone resins can be employed.

These additives should be contained in such an amount that does not impair the inherent properties of the photosensitive resin. A typical additive content is 0.01-10 parts by mass, preferably 0.01-5 parts by mass, per 100 parts by mass of the photosensitive resin composition.

A photosensitive resin composition of the present invention generally contains a solvent. It is preferable to employ a solvent which readily dissolves the above polyimide precursor partially or entirely. It should be noted, however, that a poor solvent may be employed as long as it improves or does not impair workability (including drying characteristics) and resin's physical properties.

The solvent content in the photosensitive resin composition is not specifically limited as long as it improves or does not impair workability (including drying characteristics) and resin's physical properties. A preferred solvent content is 30-90 wt %, preferably 45-70 wt %, based on the weight of the photosensitive resin composition. When the solvent content falls within this range, it results in improved leveling characteristics during dry film production to increase dry film quality.

Examples of the solvent contained in a photosensitive resin composition of the present invention include ketones such as acetone, methyl ethyl ketone, methyl isobutyl ketone, cyclohexanone, cyclopentanone, methyl n-amyl ketone, acetonylacetone, isophorone, and acetophenone; alcohols such as ethyl alcohol, isopropyl alcohol, n-butanol, ethylene glycol, diethylene glycol, triethylene glycol, propylene glycol, and hexylene glycol; ethers such as 1,4-dioxane, trioxane, diethyl acetal, 1,2-dioxolane, diethylene glycol dimethyl ether, and tetrahydrofuran; esters such as ethyl acetate, methyl benzoate, ethylene glycol monomethyl ether acetate, ethylene glycol monoethyl acetate, ethylene glycol monopropyl acetate, ethylene glycol diacetate, propylene glycol monomethyl ether acetate, propylene glycol monoethyl ether acetate, propylene glycol monopropyl ether acetate, propylene glycol monobutyl ether acetate, propylene glycol diacetate, diethylene glycol monomethyl ether acetate, diethylene glycol monoethyl ether acetate, and diethylene glycol diacetate; hydrocarbons such as n-heptane, n-octane, cyclohexane, benzene, toluene, xylene, ethylbenzene, and diethylbenzene; and polar aprotic solvents such as dimethylsulfoxide, N,N'-dimethylacetoamide, N,N'-dimethylformamide, hexamethylphosphoramide, and N,N'-dimethylimidazolidinone. Any other solvent may be added in the photosensitive resin composition as long as the effect of the present invention is not impaired.

The solvents may be used singly or in combination. For example, use of a mixture of a low-boiling point solvent and a high-boiling point solvent can prevent foaming in the drying process and thus may enhance dry film quality.

A dry film of the present invention can be obtained for instance by uniformly applying a photosensitive resin composition in which the solid content has been adjusted to 30-90% by mass onto a colorless transparent carrier film of given thickness, and drying the applied composition. The colorless transparent carrier film may be a film made of low-density polyethylene, high-density polyethylene, polypropylene, polyester, polyethylene terephthalate, polycarbonate, polyalylate, or ethylene/cyclodecene copolymer (APEL®, Mitsui Chemicals, Inc.). As the physical properties and coating condition of the photosensitive resin composition are susceptible to water content, the carrier film is preferably a resin film with low moisture permeability. Therefore, APEL®, polyethylene terephthalate, polyethylene, and polypropylene are more preferable materials. A cover film for photosensitive resin layer protection may be attached to a dry film of the present invention which includes a photosensitive resin layer and a carrier film.

The thickness of the carrier film is typically 15-100 μm, preferably 15-75 μm. When the thickness falls within this range, the carrier film exhibits excellent coating properties, adhesion properties, rolling properties, rigidity, and cost effectiveness. More preferable is a polyethylene terephthalate film with a thickness of 15-100 μm, preferably 15-40 μm.

The cover film is preferably a low-moisture permeability resin film as is the carrier film, but is not necessarily required to be transparent. The cover film also needs to be readily peeled off and, therefore, it is required that the adhesion between the cover film and photosensitive resin layer be smaller than the adhesion between the carrier film and photosensitive resin layer. Preferably, the cover film is a resin film which is made of APEL®, polyethylene terephthalate, polyethylene or polypropylene and is 5-100 μm in thickness.

Application of a photosensitive resin composition onto a carrier film can be accomplished with a known means such as a reverse roll coater, gravure roll coater, comma coater, or curtain coater. Drying of the resulting coat is accomplished by hot-air drying or with a dryer using far infrared rays or near infrared rays, at a temperature of 50 to 120° C., preferably 60 to 100° C., for a period of 2-30 minutes.

After removing the cover film, the dry film is placed onto a circuit surface of a printed wiring board and is then thermally press-bonded by a known method such as plane pressing or roll pressing at a pressure of 0.2-3 MPa at 40-150° C., preferably at 50-120° C. In this way a photosensitive coat is formed on the circuit surface of the printed wiring board.

Herein, an article having a photosensitive coat or the like produced from the above dry film is referred to as a "processed product."

By setting the thermal press bonding-permitting temperature to 40° C. or higher, alignment operations before press bonding are free from any troubles attributable to tackiness. By setting this temperature to 150° C. or lower, it is possible to prevent excessive curing of the photosensitive resin to provide enough time for press bonding, whereby a process margin can be widely taken. The thermal press bonding-permitting temperature means a temperature at which resin can sufficiently plug the patterns without causing problems of remaining voids and the resultant photosensitive resin film can be controlled so as to have such a viscosity that the resin does not flow out of the patterns.

When a vacuum laminator is employed for the formation of a photosensitive resin layer on a printed wiring board, plugging of the circuit pattern on the printed wiring board improves.

The laminated dry film is exposed through a desired patterned photomask and developed to generate microholes and fine lines in the photosensitive resin layer on the printed wiring board. Examples of active energy beams used for exposure include electron beams, ultraviolet ray and X-ray, with ultraviolet ray being preferable. As a light source, it is possible to use a low-pressure mercury lamp, high-pressure mercury lamp, extra-high-pressure mercury lamp, halogen lamp, etc. The exposure dose is typically 100-1,000 mJ/cm$^2$.

After the exposure, the dry film is developed to remove non-exposed portions. Development is carried out by, for example, an immersion method or spraying method. As a developer, alkali aqueous solution (e.g., sodium hydroxide aqueous solution or sodium carbonate aqueous solution) is employable. After the development, the dry film is generally rinsed with water to remove remaining developer. Before water rinsing, developer components may be removed with a dilute acid aqueous solution.

After the development and water rinsing, the patterned photosensitive resin may be cured by heat treatment to serve as a permanent protection film. The heat treatment is carried out continuously or stepwise at 140-450° C., preferably at 150-250° C. for 0.1-5 hours.

EXAMPLES

Hereinafter, the present invention will be described in more detail with reference to representative Examples, which however shall not be construed as limiting the scope of the invention thereto. The following sample evaluations were made in Examples and Comparative Examples.

(1) Migration Resistance Test

A polyimide board with a 12 μm-thick comb-shaped copper circuit with a 35 μm pitch line/space pattern was prepared. 30VDC was applied for 1,000 hours at 85° C. and 85% RH to confirm the occurrence of short circuits due to insulation deterioration.

(2) Bending Durability Test

Evaluation was made in accordance with JIS C5016. An evaluation substrate was prepared which consists of a 25 μm-thick polyimide layer and a 18 μm-thick copper layer and has a 50 μm pitch line/space circuit pattern. The test was conducted under the following condition: R=0.38; load=500 g; and rate=175 bends/min.

(3) Slide Bending Test

Evaluation was made in accordance with JIS C5016. An evaluation substrate was prepared which consists of a 25 μm-thick polyimide layer and a 9 μm-thick copper layer and has a 50 μm pitch line/space circuit pattern. The test was conducted under the following condition: gap=4 mm; stroke=30 mm; temperature=40° C.; and rate=1,500 cycles/min.

Warpage Evaluation Test

A three-layer copper clad flexible laminate consisting of a 9 μm-thick copper layer, a 18 μm-thick polyimide layer and a 9 μm-thick copper layer ("NEOFLEX® NFX-2ABEPFE (18Q)" from Mitsui Chemicals, Inc.) was prepared. The copper foil on either side of the flexible laminate was removed by etching, and a 25 μm-thick photosensitive resin layer was attached to one side of the exposed polyimide film to prepare a test piece. The test piece was then cut into a 10 cm square, and the height was measured at each corner.

Flame Retardancy Test

Evaluation was made in accordance with the UL94 Thin Material Vertical Burning Test. A three-layer copper clad flexible laminate consisting of a 9 μm-thick copper layer, a 18 μm-thick polyimide layer and a 9 μm-thick copper layer ("NEOFLEX® NFX-2ABEPFE(18Q)" from Mitsui Chemicals, Inc.) was prepared. The copper foil on either side of the flexible laminate was removed by etching, and a 25 μm-thick photosensitive resin layer was attached to both sides of the exposed polyimide film to prepare a test piece. The test piece was evaluated for flame retardancy.

Example 1

Synthesis of Polyimide Precursor

A 300 ml-separable was flask fitted with a stirrer, Dean-Stark trap, reflux condenser, 100 ml-dropping funnel, and nitrogen inlet. In a nitrogen atmosphere, the flask was charged with 93.3 g N-methylpyrrolidone (Tokyo Chemical Industry Co., Ltd.), 40.0 g mesitylene (Kanto Chemical Co., Inc.) and 60.8 g oxydiphthalic acid dianhydride (MANAC Incorporated). With stirring, 57.9 g amino-terminated polypropylene glycol ("JEFFAMINE D400" from Huntsman Corporation) was added dropwise in the flask over 1 hour. The internal temperature was raised to 180° C. After 8.5 hour-reflux at 180° C., the flask was cooled to room temperature. Thereafter, 15.9 g 1,3-bis(3-aminophenoxy)benzene (Mitsui Chemicals, Inc.) was added in the flask. Stirring was continued for 20 hours in a nitrogen atmosphere to produce a partially-imidized polyamic acid solution (polyimide precursor solution) with a solid content of 49 wt %.

Preparation of Photosensitive Resin Composition

At 21° C., to 63.1 g polyimide precursor solution obtained above was added: 13.3 g dipentaerythritol hexa/pentaacrylate ("ARONIX M-402" from TOAGOSEI Co., Ltd.) and 11.8 g N,N'-dimethylacetoamide; as a photopolymerization initiator 0.5 g diethylthioxanthone ("KAYACURE-DETX-S" from Nihon Kayaku Tokyo Co., Ltd.); 1.1 g ethyl p-dimethylaminobenzoate ("KAYACURE-EPA" from Nihon Kayaku Tokyo Co., Ltd.); as a flame retardant 10.0 g hexa(phenoxy)cyclotriphosphazene ("SPE-100" from Otsuka Chemical Co., Ltd.); and 0.1 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film ("M5001" from TOYOBO Co., Ltd.) which is 30 cm in width and 19 μm in thickness, and dried in a circulating hot air oven for 8 minutes at 100° C. A 30 μm-thick polyethylene terephthalate cover film ("GF-130" from TAMAPOLY Co., Ltd.) was attached to the photosensitive resin layer to produce a dry film.

After peeling off the cover film, the dry film was placed onto respective boards for evaluation. After alignment, the dry film was bonded by pressing with a vacuum laminator ("MVLP 600" from Meiki Co., Ltd.) for 60 seconds (press temperature=60° C., pressure=0.5 MPa). The dry film was exposed to UV light through a given photomask at a dose of 600 mJ/cm$^2$ and sprayed with 30° C. 1.0% $Na_2CO_3$ aqueous solution at a pressure of 0.20 MPa to develop away non-exposed portions. After water rinsing and drying, the processed product was placed in a 160° C. circulating hot air oven for 60 minutes for heat curing.

The above evaluations were conducted for the cured film obtained above. In the migration resistance test, resistance was over $10^9 \Omega$, even after 1,000 hour-VDC application, and no copper migration was observed. The average value found in the bending durability test was 290. In the slide bending test, the cure film withstood one million cycles, demonstrating that it had excellent flexibility. The warpage amount was small; the average of the heights at the corners was 2 mm. Moreover, flame rentardancy was high enough to satisfy the VTM-0 specification.

Example 2

Synthesis of Polyimide Precursor

A 300 ml-separable was flask fitted with a stirrer, Dean-Stark trap, reflux condenser, 100 ml-dropping funnel, and nitrogen inlet. In a nitrogen atmosphere, the flask was charged with 93.6 g N-methylpyrrolidone (Tokyo Chemical Industry Co., Ltd.), 40.1 g mesitylene (Kanto Chemical Co., Inc.) and 62.0 g oxydiphthalic acid dianhydride (MANAC Incorporated). With stirring, 50.4 g amino-terminated polypropylene glycol ("JEFFAMINE D400" from Huntsman Corporation) was added dropwise in the flask over 1 hour. The internal temperature was raised to 180 C. After 8.5 hour-reflux at 180° C., the flask was cooled to room temperature. Thereafter, 21.6 g 1,3-bis(3-aminophenoxy)benzene (Mitsui Chemicals, Inc.) was added in the flask. Stirring was continued for 20 hours in a nitrogen atmosphere to produce a partially-imidized polyamic acid solution (polyimide precursor solution) with a solid content of 49 wt %.

Preparation of Photosensitive Resin Composition

At 21° C., to 61.0 g polyimide precursor solution obtained above was added: 20.1 g dipentaerythritol hexa/pentaacrylate ("ARONIX M-402" from TOAGOSEI Co., Ltd.) and 7.2 g N,N'-dimethylacetoamide; as a photo polymerization initiator 0.8 g diethylthioxanthone ("KAYACURE-DETX-S" from Nihon Kayaku Tokyo Co., Ltd.); 1.6 g ethyl p-dimethylaminobenzoate ("KAYACURE-EPA" from Nihon Kayaku Tokyo Co., Ltd.); as a flame retardant 9.1 g hexa(phenoxy)cyclotriphosphazene ("SPE-100" from Otsuka Chemical Co., Ltd.); and 0.2 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film and cured as in Example 1. The cured film obtained was similarly evaluated. In the migration resistance test, resistance was over $10^9 \Omega$ even after 1,000 hour-VDC application, and no copper migration was observed. The average value found in the bending durability test was 150, demonstrating high flexibility. The warpage amount was small; the average of the heights at the corners was 5 mm. Flame rentardancy was high enough to satisfy the VTM-0 specification.

Example 3

Preparation of Photosensitive Resin Composition

At 21° C., to 63.1 g polyimide precursor solution obtained as in Example 1 was added: 13.3 g condensate of dipentaerythritol and s-caprolactone where all of the 6 terminal functional groups are esterified with an acrylic acid ("KAYARAD-DPCA60" from Nihon Kayaku Tokyo Co., Ltd.) and 11.8 g N,N'-dimethylacetoamide; as a photopolymerization initiator 0.5 g diethylthioxanthone ("KAYACURE-DETX-S" from Nihon Kayaku Tokyo Co., Ltd.); 1.1 g ethyl p-dimethylaminobenzoate ("KAYACURE-EPA" from Nihon Kayaku Tokyo Co., Ltd.); as a flame retardant 10.0 g hexa (phenoxy)cyclotriphosphazene ("SPE-100" from Otsuka Chemical Co., Ltd.); and 0.1 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film and cured as in Example 1. The cured film obtained was similarly evaluated. In the migration resistance test, resistance was over $10^8 \Omega$ even after 1,000 hour-VDC application, and no copper migration was observed. The average value found in the bending durability test was 310, demonstrating high flexibility. Almost no warpage was observed; the average of the heights at the corners was 0 mm. Flame rentardancy was high enough to satisfy the VTM-0 specification.

Example 4

Preparation of Photosensitive Resin Composition

At 21° C., to 63.1 g polyimide precursor solution obtained as in Example 2 was added: 13.3 g dipentaerythritol hexa/ pentaacrylate ("ARONIX M-402" from TOAGOSEI Co., Ltd.) and 11.8 g N,N'-dimethylacetoamide; as a photopolymerization initiator 0.5 g diethylthioxanthone ("KAYACURE-DETX-S" from Nihon Kayaku Tokyo Co., Ltd.); 1.1 g ethyl p-dimethylaminobenzoate ("KAYACURE-EPA" from Nihon Kayaku Tokyo Co., Ltd.); as a flame retardant 10.0 g cyano group-containing hexa(phenoxy)cyclotriphazene ("FP-300" from FUSHIMI Pharmaceutical Co., Ltd.); and 0.1 g phenylimidazole ("CUREZOL 2PZ-PW" from Shikoku Chemical Corporation). The mixture was stirred for 30 minutes to produce a brown viscous liquid with a viscosity of about 2 Pa·s. The flame retardant used in Example 4 showed high solubility, offering excellent handleability during photosensitive resin solution preparation.

Production and Evaluation of Dry Film

The photosensitive resin composition obtained above was applied onto a polyethylene terephthalate carrier film and cured as in Example 1. The cured film obtained was similarly evaluated. In the migration resistance test, resistance was over $10^8 \Omega$ even after 1,000 hour-VDC application, and no copper migration was observed. The average value found in the bending durability test was 400, demonstrating high flexibility. Almost no warpage was observed; the average of the heights at the corners was 1 mm. Flame rentardancy was high enough to satisfy the VTM-0 specification.

Example 5

Synthesis of Polyimide Precursor

A 300 ml-separable was flask fitted with a stirrer, Dean-Stark trap, reflux condenser, 100 ml-dropping funnel, and nitrogen inlet. In a nitrogen atmosphere, the flask was charged with 98.0 g N-methylpyrrolidone (Tokyo Chemical Industry Co., Ltd.), 42.0 g mesitylene (Kanto Chemical Co., Inc.) and 46.5 g oxydiphthalic acid dianhydride (MANAC Incorporated). With stirring, 9.3 g 1,12-dodecanediamine (INVISTA JAPAN K.K.) and 47.8 g amino-terminated polyoxyalkylene ("JEFFAMINE XTJ542" from Huntsman Corporation) were added dropwise in the flask over 1 hour. The internal temperature was raised to 180° C. After 8.5 hour-reflux at 180° C., the flask was cooled to room temperature. Thereafter, 15.9 g 1,3-bis(3-aminophenoxy)benzene (Mitsui Chemicals, Inc.) was added in the flask. Stirring was continued for 20 hours in a nitrogen atmosphere to produce a partially-imidized polyamic acid solution (polyimide precursor solution) with a solid content of 45 wt %.

Preparation of Photosensitive Resin Composition

At 21° C., to 64.0 g polyimide precursor solution obtained above was added: 12.4 g dipentaerythritol hexa/pentaacrylate ("ARONIX M-402" from TOAGOSEI Co., Ltd.) and 6.4 g N,N'-dimethylacetoamide; as a photopolymerization initiator 0.5 g diethylthioxanthone ("KAYACURE-DETX-S" from Nihon Kayaku Tokyo Co., Ltd.); 1.1 g ethyl p-dimethylaminobenzoate ("KAYACURE-EPA" from Nihon Kayaku Tokyo Co., Ltd.); as a flame retardant 10.1 g cyano group-containing hexa(phenoxy)cyclotriphazene ("FP-300" from FUSHIMI Pharmaceutical Co., Ltd.); and 0.1 g phenylimidazole ("CUREZOL 2PZ-PW" from Shikoku Chemical Corporation). The mixture was stirred for 30 minutes to produce a brown viscous liquid with a viscosity of about 2 Pa·s. The flame retardant used in Example 5 showed high solubility, offering excellent handleability during photosensitive resin solution preparation.

Production and Evaluation of Dry Film

The photosensitive resin composition obtained above was applied onto a polyethylene terephthalate carrier film and cured as in Example 1. The cured film obtained was similarly evaluated. In the migration resistance test, resistance was over $10^8 \Omega$ even after 1,000 hour-VDC application, and no copper migration was observed. The average value found in the bending durability test was 350, demonstrating high flexibility. The warpage amount was small; the average of the heights at the corners was 5 mm. Flame rentardancy was high enough to satisfy the VTM-0 specification.

Comparative Example 1

Preparation of Photosensitive Resin Composition

At 21° C., to 61.0 g polyimide precursor solution obtained as in Example 1 was added: 20.1 g urethane acrylate having 2 acryloyl groups in the molecule ("Blenmer DP403AU" from NOF Corporation) and 7.2 g N,N'-dimethylacetoamide; as a photopolymerization initiator 0.8 g diethylthioxanthone ("KAYACURE-DETX-S" from Nihon Kayaku Tokyo Co., Ltd.); 1.6 g ethyl p-dimethylaminobenzoate ("KAYACURE-EPA" from Nihon Kayaku Tokyo Co., Ltd.); as a flame retardant 9.1 g hexa(phenoxy)cyclotriphosphazene ("SPE-100" from Otsuka Chemical Co., Ltd.); and 0.2 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film and cured as in Example 1. The cured film obtained was similarly evaluated. The average value found in the bending durability test was 137, demonstrating high flexibility. Almost no warpage was observed; the average of the heights at the corners was 1 mm. Flame rentardancy was high enough to satisfy the VTM-0 specification. However, short circuits occurred immediately after the start of a migration resistance test. Copper migration was observed in the dry film. Thus, the dry film was poor in insulation reliability.

Comparative Example 2

Preparation of Photosensitive Resin Composition

At 21° C., to 61.0 g polyimide precursor solution obtained as in Example 1 was added: 20.1 g pentaerythritol triacrylate ("ARONIX TO-756" from TOAGOSEI Co., Ltd.) and 7.2 g N,N'-dimethylacetoamide; as a photopolymerization initiator 0.8 g diethylthioxanthone ("KAYACURE-DETX-S" from Nihon Kayaku Tokyo Co., Ltd.); 1.6 g ethyl p-dimethylaminobenzoate ("KAYACURE-EPA" from Nihon Kayaku Tokyo Co., Ltd.); as a flame retardant 9.1 g hexa(phenoxy)cyclotriphosphazene ("SPE-100" from Otsuka Chemical Co., Ltd.); and 0.2 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film and cured as in Example 1. The cured film obtained was similarly evaluated. Too large warpage occurred to perform a bending durability test. Flame rentardancy was high enough to satisfy the VTM-0 specification. However, short circuits occurred 9 hours after the start of a migration resistance test. Copper migration was observed in the dry film. Thus, the dry film was poor in insulation reliability.

Comparative Example 3

Preparation of Photosensitive Resin Composition

At 21° C., to 58.2 g polyimide precursor solution obtained as in Example 1 was added: 17.7 g urethane acrylate having 2 acryloyl groups in the molecule ("Blenmer DP403AU" from NOF Corporation), 4.4 g glycerin dimethacrylate ("Blenmer GMR-H" from NOF Corporation) and 10.1 g N,N'-dimethylacetoamide; 0.9 g diethylthioxanthone ("KAYACURE-DETX-S" from Nihon Kayaku Tokyo Co., Ltd.); 1.8 g ethyl p-dimethylaminobenzoate ("KAYACURE-EPA" from Nihon Kayaku Tokyo Co., Ltd.); 3.6 g 2,4,6-trimethylbenzoyldiphenylphosphine oxide ("Lucirin TPO" from BASF); as a flame retardant 6.9 g aromatic phosphate ("CR-747" from Daihachi Chemical Industry, Co., Ltd.); and 0.2 g phenylimidazole ("CUREZOL 2PZ-PW" from Shikoku Chemical Corporation). The mixture was stirred for 30 minutes to produce a brown viscous liquid with a viscosity of about 2 Pa·s.

Production and Evaluation of Dry Film

The photosensitive resin composition obtained above was applied onto a polyethylene terephthalate carrier film and cured as in Example 1. The cured film obtained was similarly evaluated. The average value found in the bending durability test was 92, demonstrating high flexibility. Flame retardancy was high enough to satisfy the VTM-0 specification, but warpage occurred. Moreover, short circuits occurred 180 hours after the start of a migration resistance test. Copper migration was observed in the dry film. Thus, the dry film was poor in insulation reliability.

The present application claims the priority of Japanese Patent Application No. 2007-113665 filed on Apr. 24, 2007 and Japanese Patent Application No. 2007-242638 filed on Sep. 19, 2007, the entire contents of which are herein incorporated by reference.

INDUSTRIAL APPLICABILITY

As described above, a resin composition of the present invention can exert good flame retardancy after cured even without containing any halogenated compound or any antimony compound that has a high risk of putting a load on the environment. In particular, the resin composition can provide a high-density flexible printed wiring board which can meet the recent stringent requirements for bending durability and insulation reliability. Further, as the resin composition can be readily provided in the form of dry film, it may also contribute to enhance printed wiring board productivity and reduce a load on the environment. By virtue of its photosensitivity, the resin composition can achieve high patterning accuracy. In addition, the resin composition can provide an environmentally-friendly interconnection protection film which is excellent in bending durability, flexibility, adhesion, insulation reliability, and flame retardancy.

The invention claimed is:

1. A photosensitive resin composition comprising:
   (A) (meth)acrylate compound having the following general formula (1');
   (B) polyimide precursor; and
   (C) photopolymerization initiator,
   wherein (B) polyimide precursor is a polyamic acid produced from a carboxylic acid dianhydride and a diamine composition including a diamine having the following general formula (2) and an aromatic diamine, a mole ratio of the diamine having the following general formula (2) to the aromatic diamine being 0.05 to 4.9,

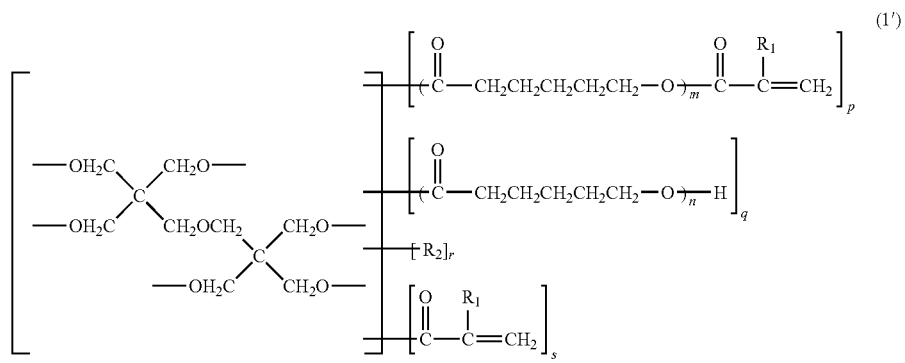

where $R_1$ denotes a hydrogen atom or methyl group; $R_2$ denotes a monovalent organic group comprising an alkyl group, a carboxy-terminated organic group formed by ring-opening addition reaction of acid anhydride with methylhydroxyl group, a vinyl group, and a glycidyl group; n and m each denote an integer of 1 to 5; p denotes an integer of 0 to 6; q and r each denote an integer of 0 to 4; and s denotes an integer of 0 to 6, wherein the sum of p, q, r and s is 6, and the sum of p and s ranges from 3 to 6,

where $R_3$ and $R_4$ each denote an aliphatic hydrocarbon group having 1-6 carbon atoms, and n denotes an integer of 1 to 30.

2. The photosensitive resin composition according to claim 1, wherein the amount of (A) (meth)acrylate compound is 3-200 parts by mass per 100 parts by mass of (B) polyimide precursor.

3. The photosensitive resin composition according to claim 1, wherein (B) polyimide precursor is a polyamic acid.

4. The photosensitive resin composition according to claim 1, further comprising (E) flame retardant in an amount of 1-70 parts by mass per 100 parts by mass of the total of (A) (meth)acrylate compound, (B) polyimide precursor and (C) photopolymerization initiator.

5. A dry film produced from a photosensitive resin composition according to claim 1.

6. A processed product comprising a dry film according to claim 5.

7. The processed product according to claim 6, wherein the processed product is a printed wiring board.

8. An electric device comprising a processed product according to claim 6.

9. The photosensitive resin composition according to claim 1, wherein the acid anhydride comprises succinic acid anhydride, itaconic acid anhydride, phthalic acid anhydride, or tetrahydrophthalic acid anhydride.

* * * * *